(12) United States Patent
Xie et al.

(10) Patent No.: US 11,164,792 B2
(45) Date of Patent: Nov. 2, 2021

(54) COMPLEMENTARY FIELD-EFFECT TRANSISTORS

(71) Applicant: International Business Machines Corporation, Armonk, NY (US)

(72) Inventors: Ruilong Xie, Niskayuna, NY (US); Alexander Reznicek, Troy, NY (US); Jingyun Zhang, Albany, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 16/737,303

(22) Filed: Jan. 8, 2020

(65) Prior Publication Data

US 2021/0210349 A1 Jul. 8, 2021

(51) Int. Cl.
| H01L 21/8238 | (2006.01) |
|---|---|
| H01L 21/02 | (2006.01) |
| H01L 21/762 | (2006.01) |
| H01L 21/8234 | (2006.01) |
| H01L 29/06 | (2006.01) |
| H01L 29/66 | (2006.01) |

(Continued)

(52) U.S. Cl.
CPC ...... *H01L 21/8238* (2013.01); *H01L 21/0262* (2013.01); *H01L 21/02381* (2013.01);
(Continued)

(58) Field of Classification Search
CPC ......... H01L 21/02381; H01L 21/02532; H01L 21/02587; H01L 21/02603; H01L 21/76224; H01L 21/8232; H01L 21/823431; H01L 21/823468; H01L 21/823481; H01L 21/8238; H01L 21/823807; H01L 21/823821; H01L 21/823828; H01L 27/085; H01L 27/092; H01L 27/0922; H01L 27/0924; H01L 29/0649; H01L 29/0669; H01L 29/0847;
(Continued)

(56) References Cited

U.S. PATENT DOCUMENTS 9,837,414 B1 * 12/2017 Balakrishnan ............................ H01L 21/823871
9,905,643 B1 2/2018 Bergendahl et al.
(Continued)

FOREIGN PATENT DOCUMENTS

JP 2018506861 A 3/2018

OTHER PUBLICATIONS

N. Loubet et al., "Stacked Nanosheet Gate-All-Around Transistor to Enable Scaling Beyond FinFET," Symposium on VLSI Technology Digest of Technical Papers, Jun. 5-8, 2017, pp. T230-T231.
(Continued)

*Primary Examiner* — Cheung Lee
(74) *Attorney, Agent, or Firm* — Jeffrey S LaBaw; Ryan, Mason & Lewis, LLP (57) ABSTRACT

A semiconductor structure includes a first field-effect transistor disposed on a substrate. The first field-effect transistor includes a stack of nanosheet layers, a first gate, and a first source/drain region. The semiconductor structure further includes a second field-effect transistor vertically stacked above the first field-effect transistor. The second field-effect transistor includes a plurality of nanowires, a second gate, and a second source/drain region. The first gate and the second gate are vertically aligned. The first source/drain region and the second source/drain region are vertically aligned.

20 Claims, 11 Drawing Sheets

(51) Int. Cl.
*H01L 29/08* (2006.01)
*H01L 29/423* (2006.01)

(52) U.S. Cl.
CPC .. *H01L 21/02532* (2013.01); *H01L 21/02603* (2013.01); *H01L 21/76224* (2013.01); *H01L 21/823431* (2013.01); *H01L 21/823468* (2013.01); *H01L 21/823481* (2013.01); *H01L 21/823821* (2013.01); *H01L 29/0649* (2013.01); *H01L 29/0669* (2013.01); *H01L 29/0847* (2013.01); *H01L 29/42392* (2013.01); *H01L 29/66545* (2013.01)

(58) Field of Classification Search
CPC ............... H01L 29/41; H01L 29/42316; H01L 29/42384; H01L 29/42392; H01L 29/66007; H01L 29/785
See application file for complete search history.

(56) References Cited

U.S. PATENT DOCUMENTS

| | | | |
|---|---|---|---|
| 9,911,734 B2 | 3/2018 | Cheng et al. | |
| 9,911,834 B2 | 3/2018 | Cheng et al. | |
| 9,985,138 B2 | 5/2018 | Bergendahl et al. | |
| 10,026,652 B2 | 7/2018 | Wang et al. | |
| 10,192,819 B1 | 1/2019 | Chanemougame et al. | |
| 10,192,867 B1 | 1/2019 | Frougier et al. | |
| 10,243,043 B2 | 3/2019 | Mochizuki et al. | |
| 10,256,158 B1* | 4/2019 | Frougier | H01L 21/823807 |
| 10,297,664 B2 | 5/2019 | Xie | |
| 2017/0309719 A1 | 10/2017 | Sun et al. | |
| 2018/0047922 A1 | 2/2018 | Forrest et al. | |
| 2018/0301564 A1 | 10/2018 | Kwon et al. | |
| 2019/0057867 A1 | 2/2019 | Smith et al. | |
| 2019/0131395 A1* | 5/2019 | Lee | H01L 21/823828 |
| 2019/0157414 A1 | 5/2019 | Ando et al. | |
| 2020/0105751 A1* | 4/2020 | Dewey | B82Y 10/00 |

OTHER PUBLICATIONS

H. Wakabayashi et al., "Vertically-Stacked Nanowire/FinFETs and Following 2D FETs for Logic Chips," IEEE SOI-3D-Subthreshold Microelectronics Technology Unified Conference (S$S), Oct. 15-18, 2018, 3 pages.

J. Ryckaert et al., "The Complementary FET (CFET) for CMOS Scaling Beyond N3," IEEE Symposium on VLSI Technology Digest of Technical Papers, Jun. 18-22, 2018, pp. 141-142.

* cited by examiner

COMPLEMENTARY FIELD-EFFECT TRANSISTORS

BACKGROUND

A complementary field-effect transistor (CFET) includes a p-type field-effect transistor (PFET) vertically stacked on top of an n-type field-effect transistor (NFET) or vice versa. A CFET can utilize gate-all-around technology when stacking PFET and NFET transistor on top of each other. Stacking can permit smaller scale devices, but can also be problematic when patterning gate stack materials such as NFET and PFET with different work function metals.

SUMMARY

Illustrative embodiments of the present application include techniques for use in semiconductor manufacture. In one illustrative embodiment, a semiconductor structure comprises a first field-effect transistor disposed on a substrate. The first field-effect transistor comprises a stack of nanosheet layers, a first gate, and a first source/drain region. The semiconductor structure further comprises a second field-effect transistor vertically stacked above the first field-effect transistor. The second field-effect transistor comprises a plurality of nanowires, a second gate, and a second source/drain region. The first gate and the second gate are vertically aligned. The first source/drain region and the second source/drain region are vertically aligned.

In another illustrative embodiment, a semiconductor structure comprises a first field-effect transistor disposed on a substrate. The first field-effect transistor comprises a stack of nanosheet layers, a first gate, and a first source/drain region. A second field-effect transistor is vertically stacked above the first field-effect transistor. The second field-effect transistor comprises a plurality of nanowires, a second gate, and a second source/drain region. The first gate and the second gate are vertically aligned. The first source/drain region and the second source/drain region are vertically aligned. The first field-effect transistor is one of an n-type field-effect transistor and a p-type field-effect transistor and the second field-effect transistor is another one of an n-field-effect transistor and a p-field-effect transistor.

In another illustrative embodiment, a method comprises forming a first stack of nanosheet layers on a substrate and a second stack of nanosheet layers on the first stack of nanosheet layers. The nanosheet layers of the first stack and the second stack each comprise alternating silicon layers and silicon-germanium layers. The bottom-most layer of the second stack is a silicon-germanium layer. The first stack and the second stack are separated by a sacrificial silicon-germanium layer having a thickness greater than a thickness of the silicon-germanium layers of the first stack and the second stack. The method further comprises forming a first hardmask on a top surface of the second stack of nanosheet layers. The method further comprises patterning the hardmask and the second stack of nanosheet layers to form a plurality of nanowires. The bottom-most layer of each of the nanowires has negative tapered sidewalls and comprises the bottom-most silicon-germanium layer of the second stack and a portion of the intermediate silicon-germanium layer.

Other embodiments will be described in the following detailed description of embodiments, which is to be read in conjunction with the accompanying figures.

DETAILED DESCRIPTION

This disclosure relates generally to integrated circuits (IC), and more particularly to stacked IC structures containing complementary FETs (CFETs) which are mechanically stable, and easy for work function metal patterning between top and bottom device, and a method of forming the same.

Exemplary embodiments of the invention will now be discussed in further detail with regard to stacked IC structures containing CFETs. CFETs have been considered as the next generation device. IC chips are formed on semiconductor wafers at increasingly smaller scale. In current technology nodes, such as 7, 10 and 14 nanometer (nm) technologies, transistor devices are constructed as three-dimensional (3D) fin field-effect transistor (FINFET) structures. However, chipmakers face a myriad of challenges at 5 nm, 3 nm and beyond. Currently, traditional chip scaling continues to slow as process complexities and costs escalate at each node.

Presently there are three known CFET structures. A first structure includes a nanowire stacked on a nanowire. A second structure includes a fin over fin device structure with silicon channels. A third structure includes a nanosheet stacked on a nanosheet. However, the first and second structures require either the nanowire or fin to be very tall thereby leading to mechanical instability. In addition, it is difficult to form different work function metals for an N-FET and P-FET in a vertically stacked configuration for the third structure. Thus, it is highly desirable to form a CFET which does not have mechanical instability and work function metal patterning issues.

Accordingly, illustrative embodiments provide a CFET device which includes a N-FET (or P-FET) channel device over a P-FET (or N-FET) channel device. When manufacturing such devices, the resulting CFET device is mechanically stable and can be patterned to deposit a different work function metal on each device.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for fabricating stacked IC structures containing CFETs will be described below with reference to FIGS. 1-13. Note that the same reference numeral (100) is used to denote the semiconductor structure through the various intermediate fabrication stages illustrated in FIGS. 1 through 13. Note also that the semiconductor structure described herein can also be considered to be a semiconductor device and/or an integrated circuit, or some part thereof. For the purpose of clarity, some fabrication steps leading up to the production of the stacked IC structures containing CFETs as illustrated in FIGS. 1-13 are omitted. In other words, one or more well-known processing steps which are not illustrated but are well-known to those of ordinary skill in the art have not been included in the figures.

Figure 1:
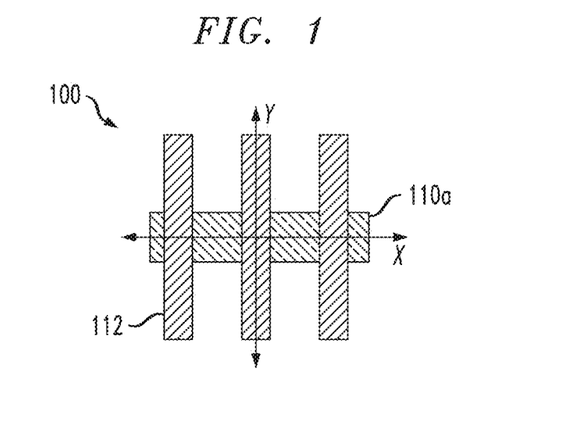
FIG. 1 depicts a plan view of a semiconductor structure indicating an X cross-section location and a Y cross-section location for each of the following figures.
Figure 2:
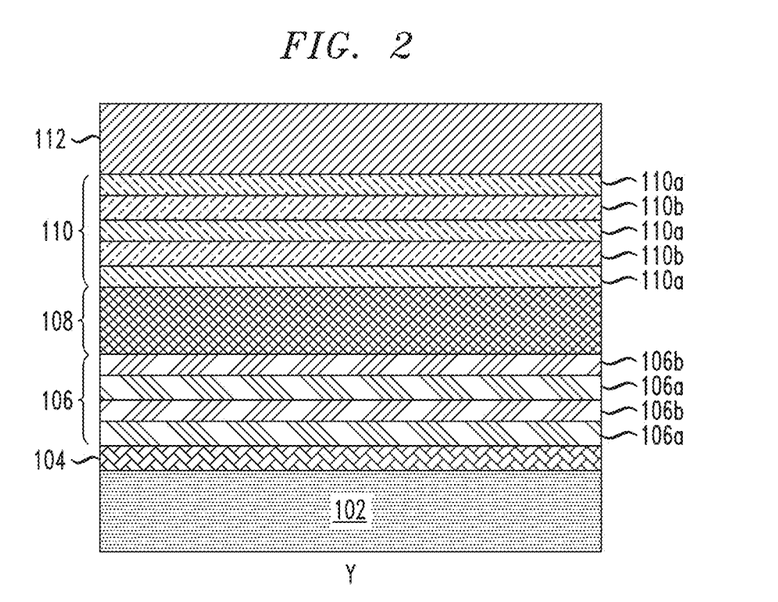
FIG. 2 is a cross sectional view of the semiconductor structure of FIG. 1 at a first-intermediate fabrication stage, according to an illustrative embodiment.

FIG. 1 illustrates a partial FET structure 100 (in plan view) indicating an X-cross section location and a Y cross-section location for identification purposes. Partial FET structure 100 includes a hardmask 112 and top of a nanosheet stack 110 as shown in FIG. 2. The X-cross section is an across-the-gate cross-section whereas the Y-cross section is an along-the-gate cross-section that is perpendicular to the X-cross section.

FIG. 2 illustrates a structure 100 used for forming the semiconductor structures of the disclosure, at a first-intermediate stage. Semiconductor structure 100 is the result of epitaxially growing a plurality of nanosheets on substrate 102. In general, substrate 102 can be composed of any currently known or later developed semiconductor material such as, for example, silicon (Si), germanium (Ge), silicon germanium (SiGe) at various Si and Ge concentrations, silicon carbide (SiC), Si:C (carbon doped silicon), silicon germanium carbide (SiGeC), carbon doped silicon germanium (SiGe:C), compound semiconductor materials (e.g. Groups III-V), or other like semiconductor material. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

An insulating layer (not shown) may be present on substrate 102 and, if present, is located between substrate 102 and bottom sacrificial epitaxial layer 104. The insulating layer can be, for example, a buried oxide layer (typically $SiO_2$) or a bottom dielectric isolation layer formed early in the process (typically SiN, SiBCN, SiOCN, SiOC, or any combination of low-k materials).

Bottom sacrificial epitaxial layer 104 is formed on substrate 102 by epitaxially growing a semiconductor material. A suitable semiconductor material for bottom sacrificial epitaxial layer 104 can be SiGe, such as, for example, $SiGe_{20-80}$. Representative examples of $SiGe_x$ can be $SiGe_{20}$, $SiGe_{25}$, $SiGe_{30}$ ... $SiGe_{65}$. The terms "epitaxial growth" and "epitaxially forming and/or growing" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

A first nanosheet stack 106 of alternating layers of silicon-germanium (SiGe) 106a and silicon (Si) 106b can be formed on top of bottom sacrificial epitaxial layer 104. First nanosheet stack 106 includes a bottom-most layer of SiGe 106a and a top-most layer of Si 106b. First nanosheet stack 106 is depicted with four layers (two SiGe layers and two Si layers), however any number and combination of layers can be used so long as the layers alternate between SiGe and Si. A suitable semiconductor material for SiGe layers 106a can be $SiGe_x$ such as, for example. $SiGe_{20-80}$. Representative examples of SiGe, can be $SiGe_{20}$, $SiGe_{25}$, $SiGe_{30}$ ... $SiGe_{65}$. The SiGe layers 106a will be different than the bottom sacrificial epitaxial layer 104.

Next, a middle sacrificial epitaxial layer 108 of SiGe is disposed on a top surface of first nanosheet stack 106. Middle sacrificial epitaxial layer 108 can be of the same semiconductor material as the SiGe layers 106a of first nanosheet stack 106. In generally, middle sacrificial epitaxial layer 108 will be of a thickness greater than the thickness of SiGe layers 106a and SiGe layers 110b discussed below. For example, middle sacrificial epitaxial layer 108 can have a thickness of about 20 nm to about 40 nm.

A second nanosheet stack 110 of alternating layers of Si 110a and SiGe 110b is disposed on middle sacrificial epitaxial layer 108. Second nanosheet stack 110 includes a bottom-most layer of Si 110a and a top-most layer of Si 110a. Second nanosheet stack 110 is depicted with five layers (two SiGe layers and three Si layers), however any number and combination of layers can be used so long as the layers alternate between SiGe layers and Si layers. A suitable semiconductor material for SiGe layers 106a can be $SiGe_x$ such as, for example, $SiGe_{20-80}$. Representative examples of $SiGe_x$ can be $SiGe_{20}$, $SiGe_{25}$, $SiGe_{30}$ ... $SiGe_{65}$. In one embodiment, SiGe layers 110b can be the same as SiGe layers 106a and different than the bottom sacrificial epitaxial layer 104.

Semiconductor structure 100 further includes a hardmask 112 deposited over the top-most surface of second nanosheet stack 110 by any conventional technique. For example, hardmask 112 can be deposited by, for example, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Suitable material for hardmask 112 includes, for example, $Si_3N_4$, SiBCN, SiNC, SiN, SiCO, $SiO_2$, and SiNOC.

Figure 3:
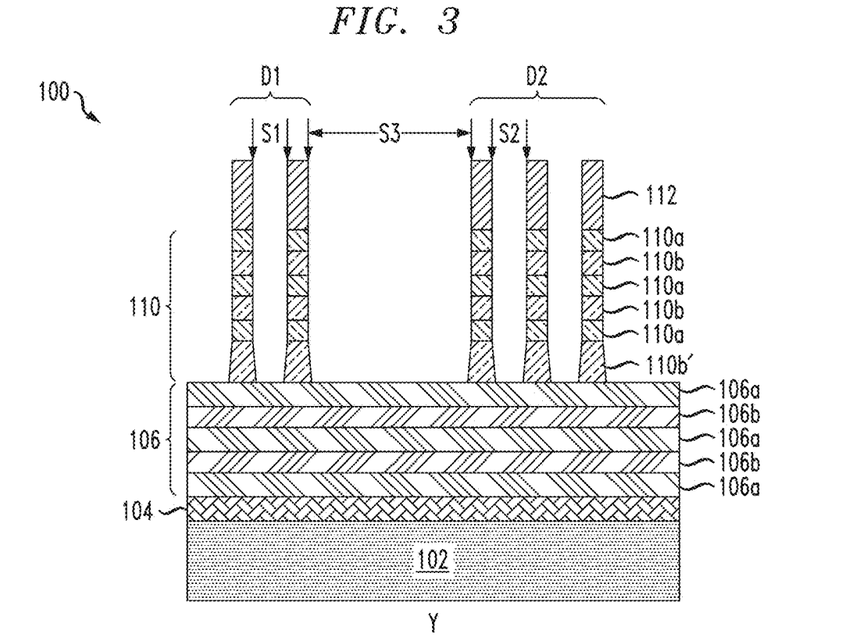
FIG. 3 is a cross sectional view of the semiconductor structure of FIG. 1 at a second-intermediate fabrication stage, according to an illustrative embodiment.

FIG. 3 illustrates the semiconductor structure 100 at a second-intermediate stage. During this stage, semiconductor structure 100 is patterned to form a first set of nanowires D1 and a second set of nanowires D2 from second nanosheet stack 110 and nanosheet layer 108. The nanowires can be fabricated using any type of multi-patterning technique such as SIT, SADP, SAQP, etch. For example, the nanowires may be fabricated using a multi-patterning process which comprises (i) depositing a layer of sacrificial material on the hardmask layer 112, (ii) patterning the layer of sacrificial material to form a pattern of sacrificial mandrel features, (iii) depositing a conformal layer of mask material (e.g., silicon dioxide ($SiO_2$)) over the sacrificial mandrel features, (iv) etching the conformal layer of mask material using an anisotropic etch-back process to form "spacer" features on the sidewalls of the sacrificial mandrel features, and then (v) etching away the sacrificial mandrel features selective to the spacer features and the hardmask layer 112 to form the first set of nanowires D1 and a second set of nanowires D2 shown in FIG. 3. The resulting first set of nanowires D1 and second set of nanowires D2 each comprise a plurality of nanowires that define the initial nanowire widths and nanowire spacing of vertical nanowires that are formed in sets D1 and D2.

When forming the nanowires of the first set of nanowires D1 and the second set of nanowires D2, the patterning process will etch a portion of middle sacrificial epitaxial layer 108 to form a bottom-most layer 110b' of second nanosheet stack 110 having negative tapered sidewalls, i.e., a top of layer 110b' is narrower in width than a bottom of layer 110b' as shown in FIG. 3. The remaining portion of middle sacrificial epitaxial layer 108 will become the top-most layer 106a of first nanosheet stack 106.

In addition, as shown in FIG. 3, the nanowires of the first set of nanowires D1 are spaced apart by spacing S1. The nanowires of the second set of nanowires D2 are spaced apart by spacing S2. In addition, the first set of nanowires D1 and the second set of nanowires D2 are spaced apart by spacing S3. As one skilled in the art will understand, the first set of nanowires D1 are part of a first CMOS comprising the PFET (or NFET) nanowires (D1) stacked on NFET (or PFET) nanosheets. In addition, the second set of nanowires D2 are part of a second CMOS comprising the PFET (or NFET) nanowires (D2) stacked on NFET (or PFET) nanosheets.

The spacings Si and S2 represent the initial spacing between vertical nanowires in the respective nanowire sets D1 and D2. In one embodiment, the values of Si and S2 are in a range of about 10 nm to about 40 nm. The spacing S3 represents the spacing between the first set of nanowires D1 and the second set of nanowires D2. In one embodiment, the values of S3 is in a range of about 30 to about 200 nm. If desired, the first set of nanowires D1 and the second set of nanowires D2 can be separately fabricated in the different device regions using a same multi-patterning process, as is readily understood by one of ordinary skill in the art. Alternatively, the first set of nanowires D1 and the second set of nanowires D2 can be simultaneously fabricated in the different device regions.

Figure 4:
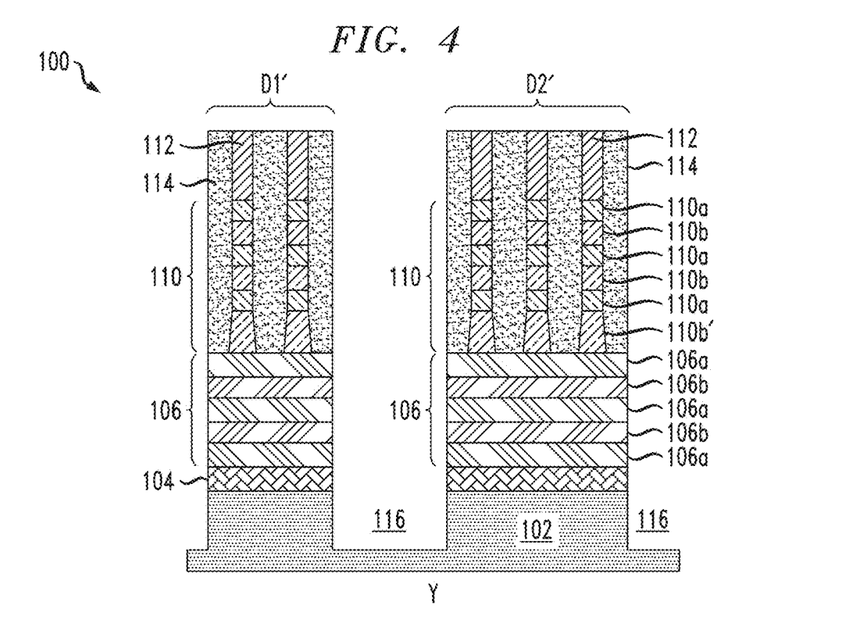
FIG. 4 is a cross sectional view of the semiconductor structure of FIG. 1 at a third-intermediate fabrication stage, according to an illustrative embodiment.

FIG. 4 illustrates the semiconductor structure 100 at a third-intermediate stage. During this stage, a sacrificial layer 114 is deposited on the exposed top-most layer of first nanosheet stack 106 and over the first set of nanowires D1 and the second set of nanowires D2. Sacrificial layer 114 can be deposited using a suitable deposition process, for example, ALD, CVD, PECVD, PVD, etc. Suitable material for sacrificial layer 114 includes, for example, SiC or SiCO. Sacrificial layer 114 will completely fill the space S1 and S2, and does not completely fill the space S3 (not shown).

After depositing the sacrificial layer 114, an etching process can be performed through sacrificial layer 114 and in a portion of substrate 102 between the first set of nanowires and the second set of nanowires defined as S3 (see, FIG. 3) to form a shallow trench 116 in substrate 102. By way of example only, the shallow trench 116 may have a depth of about 20 nm to about 200 nm. The etching process can be a self-aligned directional etching (e.g., RIE) thereby forming a first FET device D1' and second FET device D2'. As can be seen, first FET device D1' and second FET device D2' include nanowires 110 and nanosheets 106.

Figure 5:
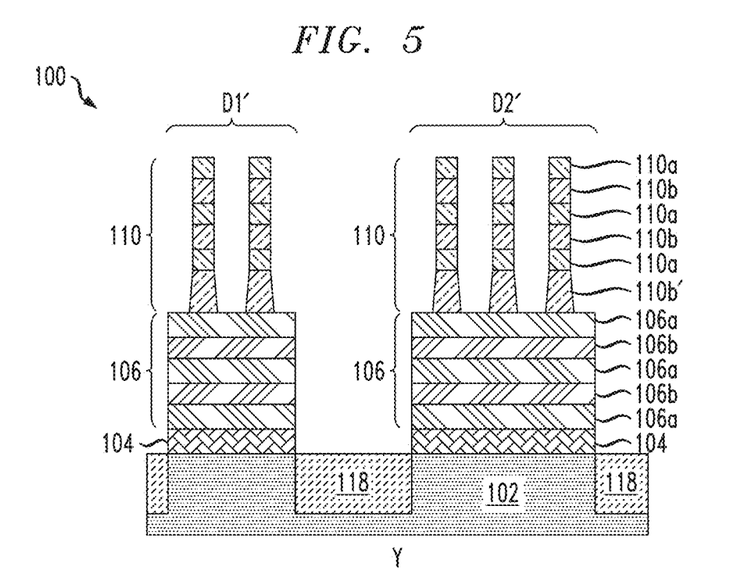
FIG. 5 is a cross sectional view of the semiconductor structure of FIG. 1 at a fourth-intermediate fabrication stage, according to an illustrative embodiment.

FIG. 5 illustrates the semiconductor structure 100 at a fourth-intermediate stage. During this stage, sacrificial layer 114 and hardmask 112 are selectively removed by, for example, a wet etch process. Next, shallow trench 116 shown in FIG. 4 is filled with a shallow trench isolation (STI) oxide material 118 (e.g., SiO$_2$) to isolate the first FET device D1' from the second FET device D2' formed on substrate 102 and thus prevent current leakage. The STI oxide deposition is followed by planarization, for example, chemical mechanical planarization (CMP) and oxide recess.

Figure 6:
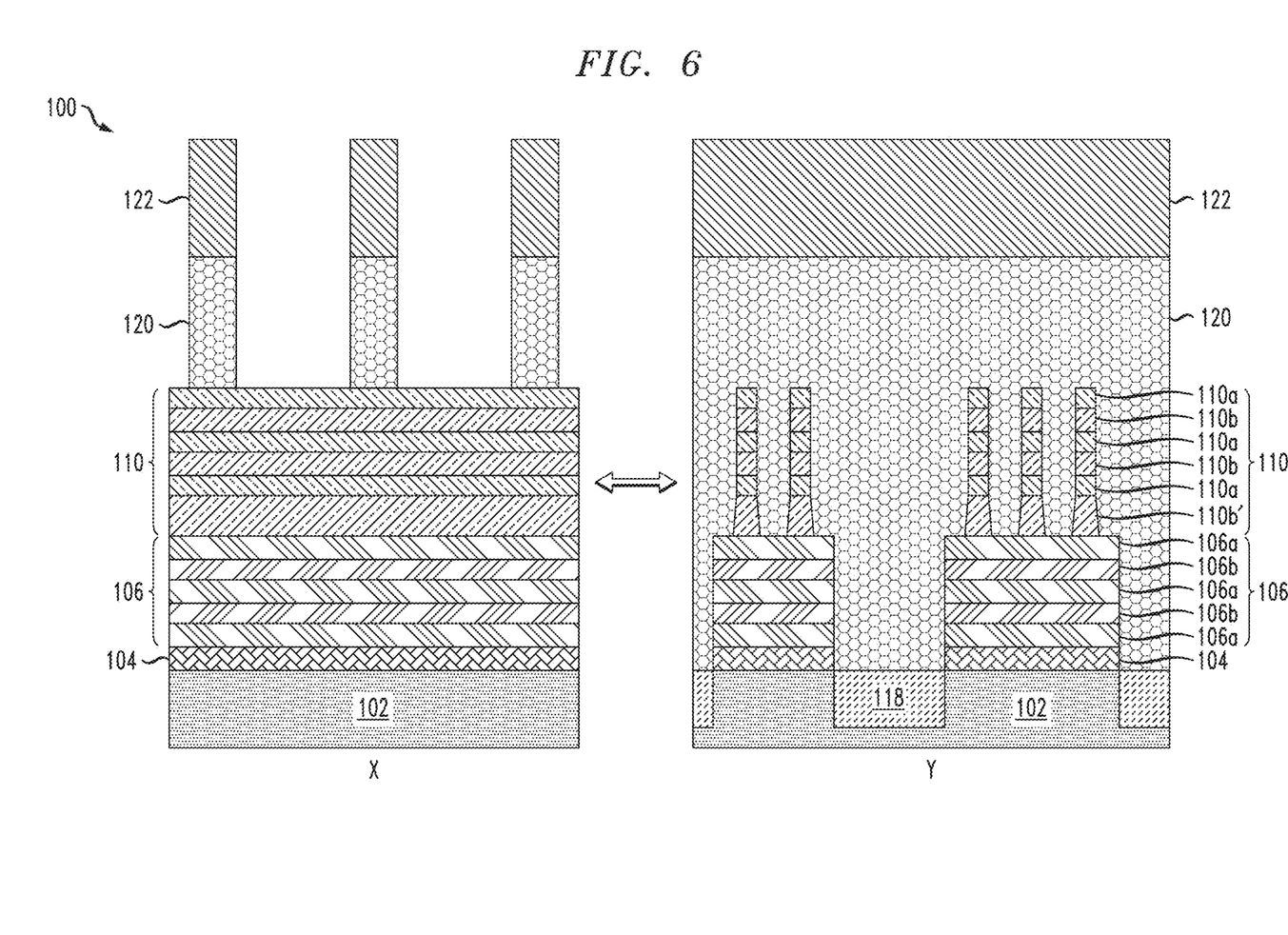
FIG. 6 is a cross sectional view of the semiconductor structure of FIG. 1 at a fifth-intermediate fabrication stage, according to an illustrative embodiment.

FIG. 6 illustrates the semiconductor structure 100 at a fifth-intermediate stage. During this stage, at least one dummy gate 120 is formed on shallow trench isolation (STI) oxide material 118 and over nanosheet stack 106 and nanowires 110. Three dummy gates 120 are shown however any number of dummy gates 120 can be formed. Dummy gates 120 can be formed by first depositing a dummy gate material over and around nanosheet stack 106 and nanowires 110 by any conventional technique such as, for example, CVD, low-pressure CVD (LPCVD), PECVD, semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, PVD, ALD, chemical oxidation, molecular beam epitaxy (MBE), plating, evaporation. Suitable dummy gate material includes, for example, polycrystalline silicon, amorphous silicon or microcrystal silicon. The dummy gate material can then be subjected to a planarizing process such as a CMP operation.

A hardmask 122 is then deposited over the planarized dummy gate material and patterned to form dummy gates. For example, an etching process, e.g., a reactive ion etching (RIE), is used to form the dummy gates 120. Suitable material for hardmask 122 includes, for example, Si$_3$N$_4$, SiBCN, SiNC, SiN, SiCO, SiO$_2$, and SiNOC.

Figure 7:
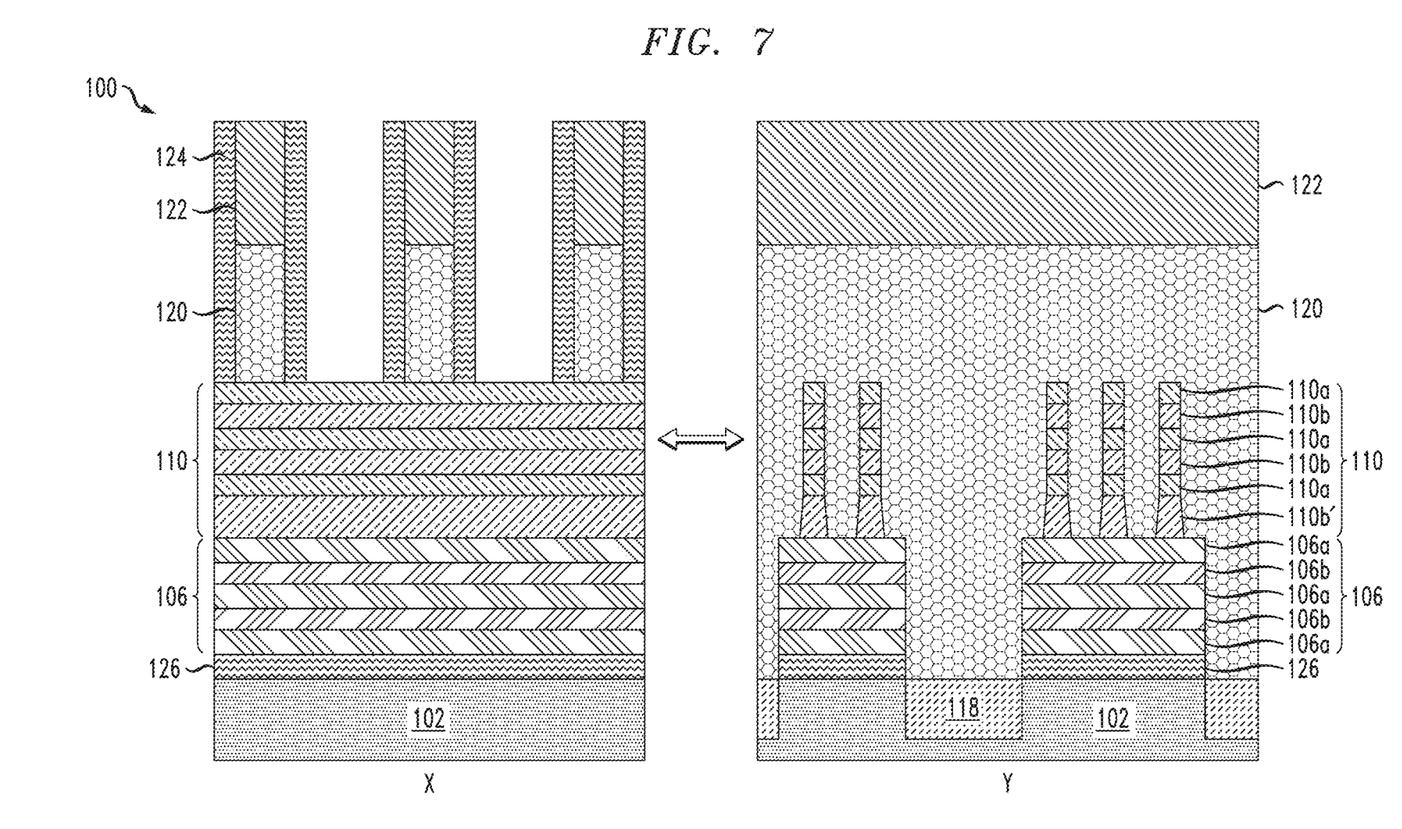
FIG. 7 is a cross sectional view of the semiconductor structure of FIG. 1 at a sixth-intermediate fabrication stage, according to an illustrative embodiment.

FIG. 7 illustrates the semiconductor structure 100 at a sixth-intermediate stage. During this stage, bottom sacrificial epitaxial layer 104 is removed by an etching process such as an isotropic RIE process to form an opening. Next, conformal gate spacers 124 are formed on sidewalls of dummy gates 120 and can extend upward along sidewalls of hardmask 122 as well. Suitable material for gate spacers 124 includes, for example, Si$_3$N$_4$, SiBCN, SiNC, SiN, SiCO, SiO$_2$, and SiNOC. Gate spacers 124 can be formed by any conventional technique such as, for example, CVD, PECVD, PVD, ALD, and the like followed by an anisotropic gate spacer RIE to remove spacer at exposed horizontal surfaces As one skilled in the art can appreciate, during deposition of gate material to form gate spacers 124, the gate material can also be deposited in the opening formed during removal of bottom sacrificial epitaxial layer 104 to form sacrificial isolation layer 126.

Figure 8:
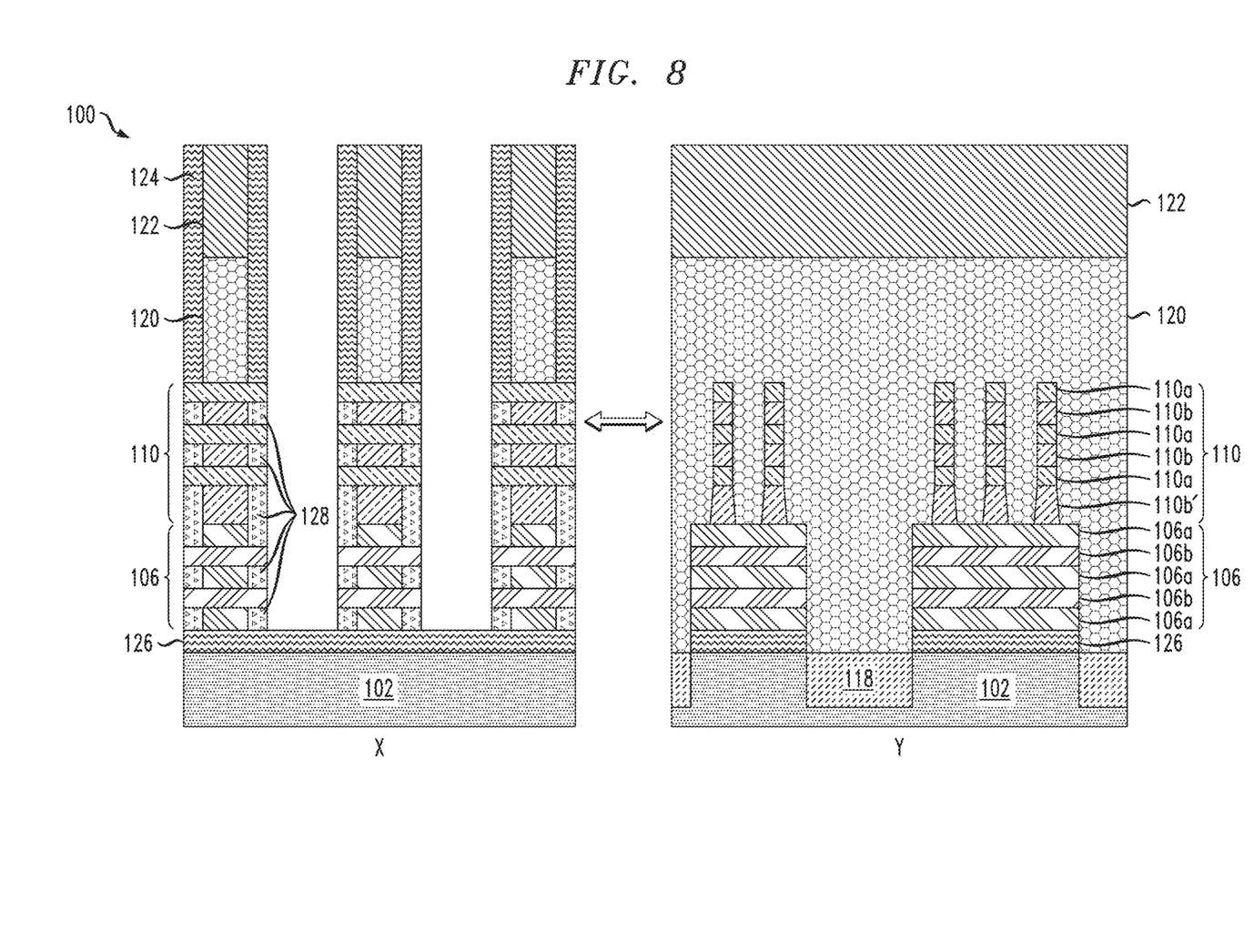
FIG. 8 is a cross sectional view of the semiconductor structure of FIG. 1 at a seventh-intermediate fabrication stage, according to an illustrative embodiment.

FIG. 8 illustrates the structure 100 at a seventh-intermediate stage. During this stage, the exposed portion of the top layer of nanowires 110 together with nanosheet stack 106 between adjacent dummy gates 120, i.e., the portions which are not underneath gate spacers 124 and dummy gates 120, are removed by etching to expose a top surface of sacrificial isolation layer 126. Etching can be carried out by using a direction etching technique such as RIE.

After etching is completed, SiGe layers 106a of nanosheet stack 106 and SiGe layers 110b of nanowires 110 are laterally etched to remove a portion of each of SiGe layers 106a and 110b and form a divot (not shown). The lateral etching of SiGe layers 106a and 110b may be performed using, for example, an isotropic etch such as gas phase etch, plasm etch, or wet etch. Inner spacers 128 are then formed in the etched portions of SiGe layers 106a and 110b. Inner spacers 128 can be composed of any suitable dielectric material, for example, silicon nitride, silicon oxide, silicon dioxide, silicon oxynitride, SiCN, SiOCN, SiOC, SiBCN, a dielectric metal oxide, a dielectric metal nitride, or a combination thereof. In one embodiment, the dielectric material is silicon nitride. Inner spacers 128 can be formed by techniques known in the art. For example, a thin dielectric layer can be deposited on substrate 102 and over dummy gates 120 filling the divots. The dielectric layer can be deposited using a deposition process, such as CVD, ALD, PECVD, metal organic chemical vapor deposition (MOCVD) or other like chemical vapor deposition processes. Next, the dielectric layer is selectively etched by an etch back process to remove the dielectric layer from the exterior surface of structure 100 while leaving the dielectric layer in the space defined by the divots to form inner spacers 128. In this exemplary embodiment, the dielectric layer can be etched back to the level of the exterior surface of nanosheet stack 106 and nanowires 110 by, for example, an isotropic etching process such as vapor phase dry etch or wet etching.

Figure 9:
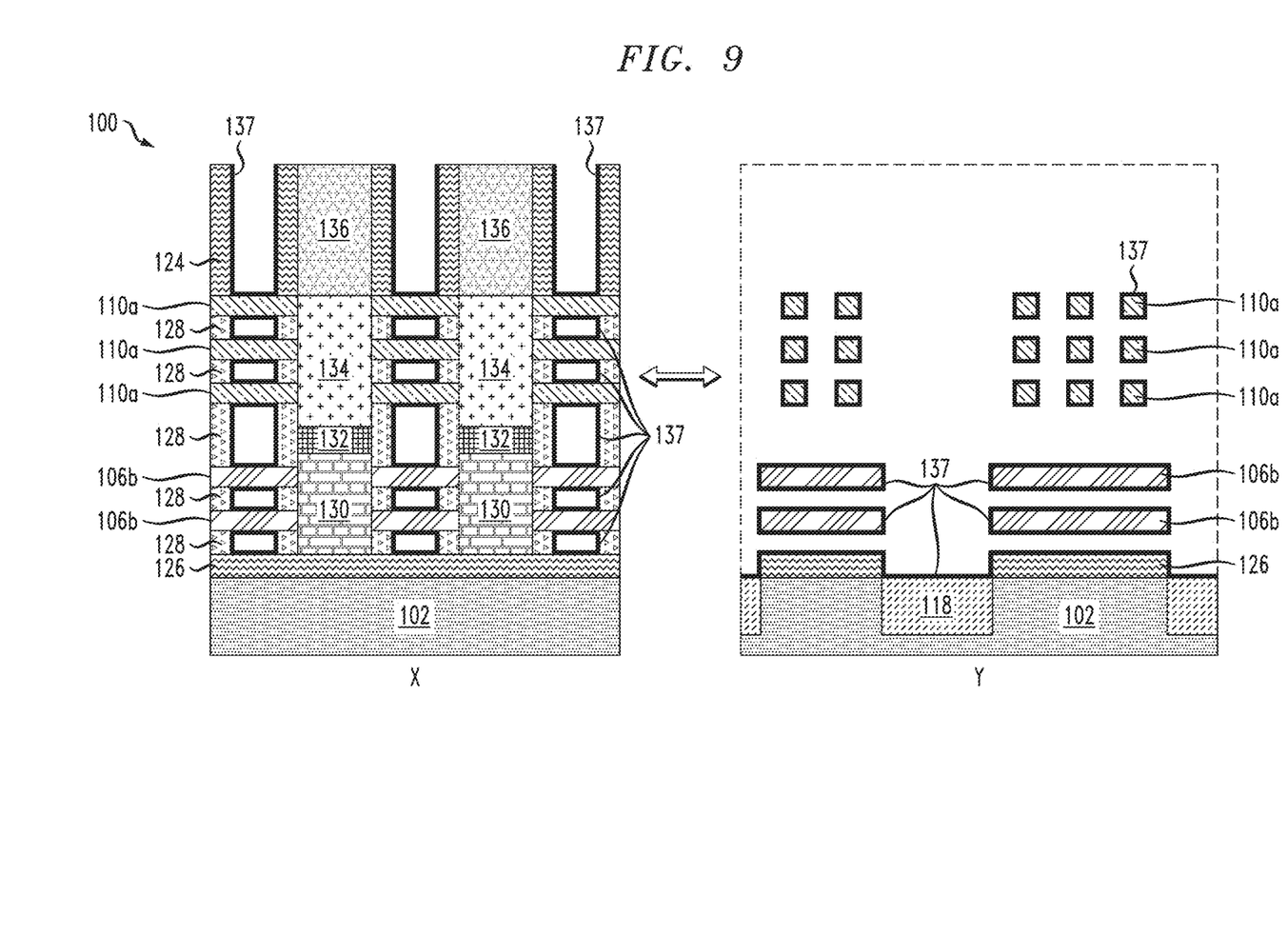
FIG. 9 is a cross sectional view of the semiconductor structure of FIG. 1 at an eighth-intermediate fabrication stage, according to an illustrative embodiment.

FIG. 9 is a cross sectional view of the semiconductor structure indicating an X cross-section location and a Y cross-section location as shown in FIG. 1 at an eighth-intermediate stage. It is to be appreciated that the dashed lines in the Y cross section location indicate support for connecting elements 106b and 110a to semiconductor structure 100, which is shown in semiconductor structure 100 set forth in the X cross-section location. During this stage, bottom source/drain regions 130 are formed, for example, in the P-FET or N-FET region, around at least a portion of nanosheet stack 106. For illustrative purposes, bottom source/drain regions 130 are P-FET source/drain regions. The bottom P-FET source/drain regions 130 can be formed by epitaxial growth processes from the exposed sidewall surfaces of the nanosheets and nanowires, followed by an etching process to remove the epitaxy on top which are grown over nanowires. The bottom P-FET source/drain regions 130 are recessed to a desired height (thickness) such as, for example, about 10 nm to about 50 nm. The epitaxially grown bottom P-FET source/drain regions 130 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (TI) at various concentrations. For example, in a non-limiting example, a dopant concentration range may be $1\times10^{18}/cm^3$ to $1\times10^{21}/cm^3$. According to an embodiment, the bottom P-FET source/drain regions 130 can include a boron doped SiGe, or a phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Next, a dielectric isolation layer 132 can be deposited on exposed surfaces of bottom P-FET source/drain regions 130 by CVD or any known method. Alternatively, dielectric isolation layer can be formed by overfilling the dielectric followed by planarization and recess. Dielectric isolation layer 132 can comprise any dielectric material including, for example, SiC (silicon carbide), $SiO_2$ or any combination thereof.

Top source/drain regions 134 are then formed, for example, in the P-FET or N-FET region, on at least a portion of dielectric isolation layer 132 and around a portion of nanowires 110. For illustration purposes, top source/drain regions 134 are N-FET source/drain regions. Top N-FET source/drain regions 134 can be formed in a similar manner as discussed above for bottom P-FET source/drain regions 130.

An interlevel dielectric (ILD) layer 136 is then deposited on a top surface of top N-FET source/drain regions 134 between adjacent gate spacers 124. The ILD layer 136 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof. The ILD layer 136 may be formed using any suitable deposition techniques including CVD, ALD, PVD, PECVD, chemical solution deposition or other like processes. ILD layer 136 is then planarized by, for example, a planarization process such as CMP such that ILD layer 136 is coplanar with dummy gate 120 and gate spacer 124 on its sidewalls (not shown).

Next, dummy gates 120 and SiGe layers 106a, 110b and 110b' are selectively removed (see white voids in FIG. 9). Any known removal process may be used that is appropriate for the material being removed. Next, a gate insulator 137, such as a high-k dielectric material, is deposited over the NFET and PFET channels using a conformal deposition process, e.g., ALD. Suitable high-k dielectric material includes, for example, $HfO_2$, $ZrO_2$, etc.

Figure 10:
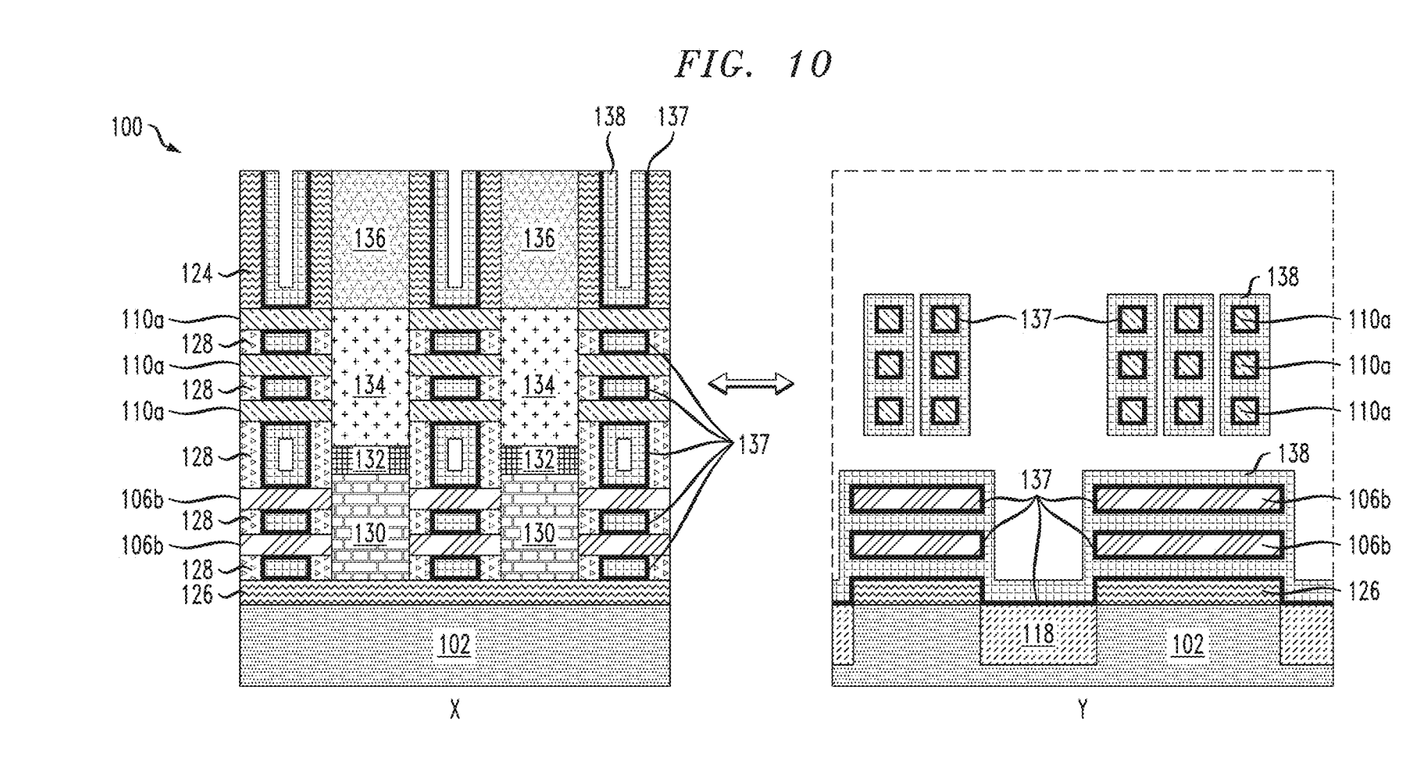
FIG. 10 is a cross sectional view of the semiconductor structure of FIG. 1 at a ninth-intermediate fabrication stage, according to an illustrative embodiment.

FIG. 10 is a cross sectional view of the semiconductor structure indicating an X cross-section location and a Y cross-section location as shown in FIG. 1 at a ninth-intermediate stage. It is to be appreciated that the dashed lines in the Y cross section location indicate support for connecting elements 110a and 138 to semiconductor structure 100, which is shown in semiconductor structure 100 set forth in the X cross-section location. During this stage, a replacement metal gate is formed in place of each dummy gate and SiGe layer. Those skilled in the art will recognize that a "replacement metal gate" refers to a gate, which replaces a previously formed dummy gate (also referred to herein as a sacrificial gate, a non-active gate, or a non-gate) and becomes an active component of the semiconductor structure being formed. More specifically, the dummy gate can be replaced with a replacement metal gate by first forming a work function metal 138 on the sidewalls of the exposed surfaces resulting from the removal of the dummy gate and SiGe layers. The work function metal 138 can comprise a metal selected so as to have a specific work function appropriate for a given type FET (e.g., an N-type FET or a P-type FET). For example, for a silicon-based N-type FET, the work function metal can comprise hafnium, zirconium, titanium, tantalum, aluminum, or alloys thereof, such as hafnium carbide, zirconium carbide, titanium carbide, tantalum carbide, or aluminum carbide, so that the work function metal has a work function similar to that of N-doped polysilicon. For a silicon-based P-type FET, the work function metal can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the work function metal has a work function similar to that of P-doped polysilicon. For illustrative purposes, work function metal 138 will be a P-FET type work metal.

Figure 11:
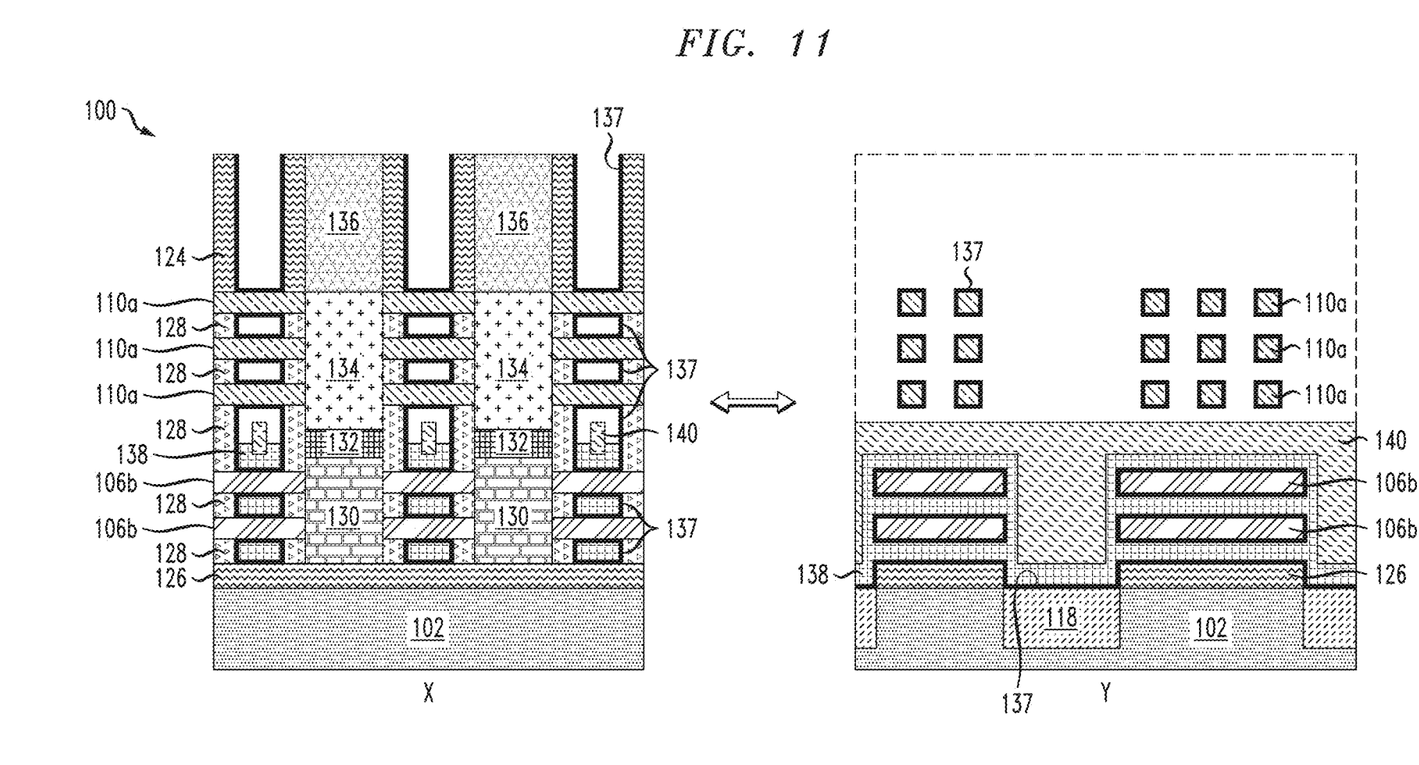
FIG. 11 is a cross sectional view of the semiconductor structure of FIG. 1 at a tenth-intermediate fabrication stage, according to an illustrative embodiment.

FIG. 11 is a cross sectional view of the semiconductor structure indicating an X cross-section location and a Y cross-section location as shown in FIG. 1 at a tenth-intermediate stage. It is to be appreciated that the dashed lines in the Y cross section location indicate support for connecting elements 110a to semiconductor structure 100, which is shown in semiconductor structure 100 set forth in the X cross-section location. During this stage, organic planarization layer (OPL) 140 is overfilled into the gate, followed by OPL recess to expose the work function metal over top sheets. Next the exposed work function metal 138 is selectively removed from between the gate spacers 124 and alternating layers 110a and a portion under the bottom-most layer 110a of nanowires 110. Work function metal 138 is selectively removed by, for example, an isotropic etching process. By forming nanowires on top, the work function removal process is simplified because no extensive isotropic etch is needed to remove the work function metal between long sheets.

The OPL 140 can be deposited using, e.g., a spin-on coating process. The OPL 140 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL 140 can include a transparent organic polymer. The OPL can be a standard $C_xH_y$ polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

Figure 12:
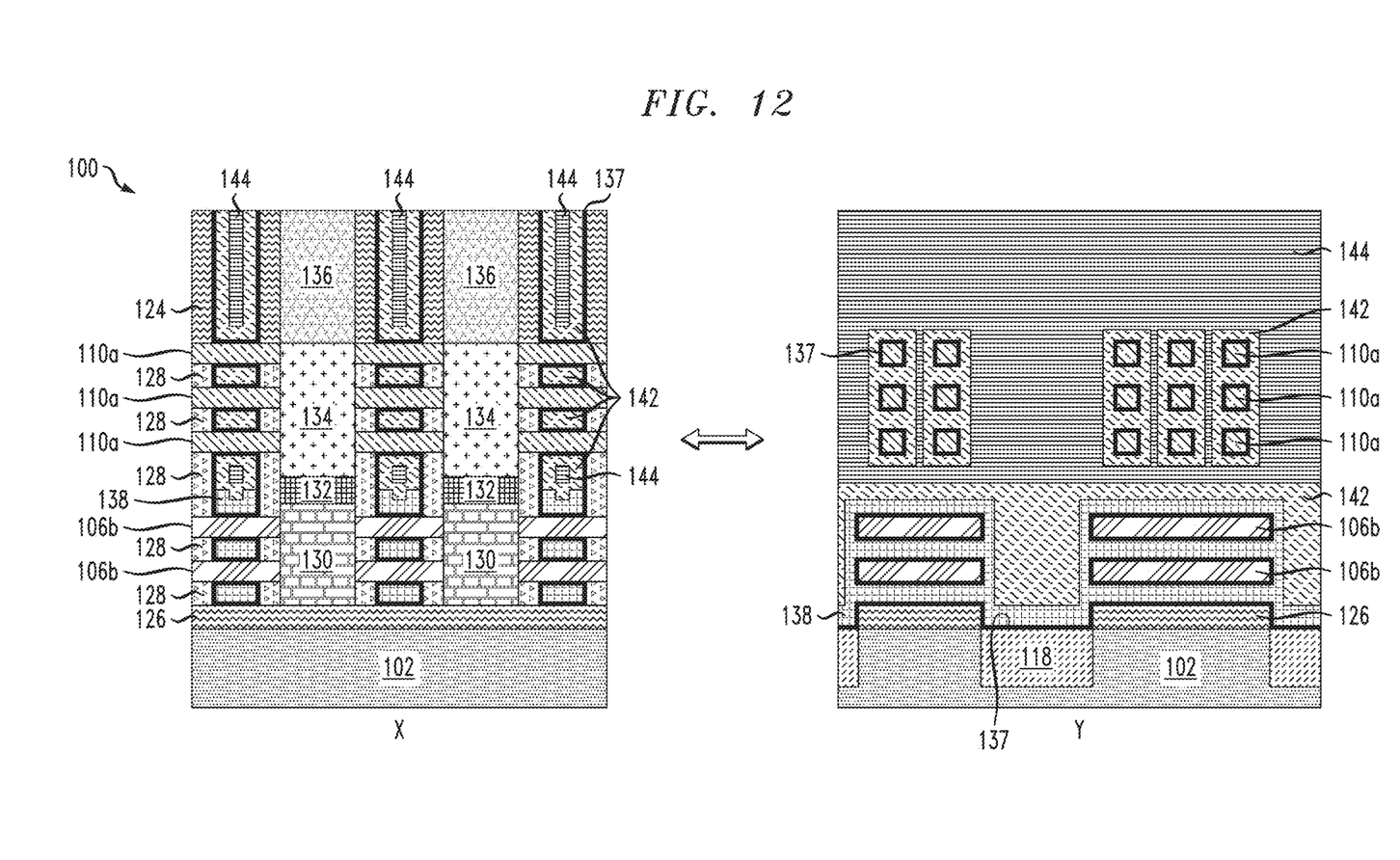
FIG. 12 is a cross sectional view of the semiconductor structure of FIG. 1 at an eleventh-intermediate fabrication stage, according to an illustrative embodiment.

FIG. 12 illustrates the structure 100 at an eleventh-intermediate stage. During this stage, OPL 140 is removed (not shown) by a standard $O_2$ or $N_2/H_2$ based OPL ash. Next, a work function metal 142 is deposited on a top surface of P-FET work function metal 138 and in place of each dummy gate 122 and SiGe layers 110b (see FIG. 9). For illustration purposes, work function metal 142 is a N-FET work function metal. N-FET work function metal 142 can be deposited as discussed above for P-FET work function metal 138. The work function metal 142 will comprise a metal selected so as to have a specific work function appropriate for the given type N-FET. For example, for a silicon-based N-type FET, the work function metal can comprise hafnium, zirconium, titanium, tantalum, aluminum, or alloys thereof, such as hafnium carbide, zirconium carbide, titanium carbide, tantalum carbide, or aluminum carbide, so that the work function metal has a work function similar to that of N-doped polysilicon.

Next, a replacement metal gate 144 such as a conductive metal is formed over N-FET work function metal 142 by known processes. The conductive metal of replacement metal gate 144 can be any suitable low resistance conducting metals such as W, Co and Ru. If desired, a high-k metal gate (HKMG) may be formed prior to depositing the conductive metal.

Figure 13:
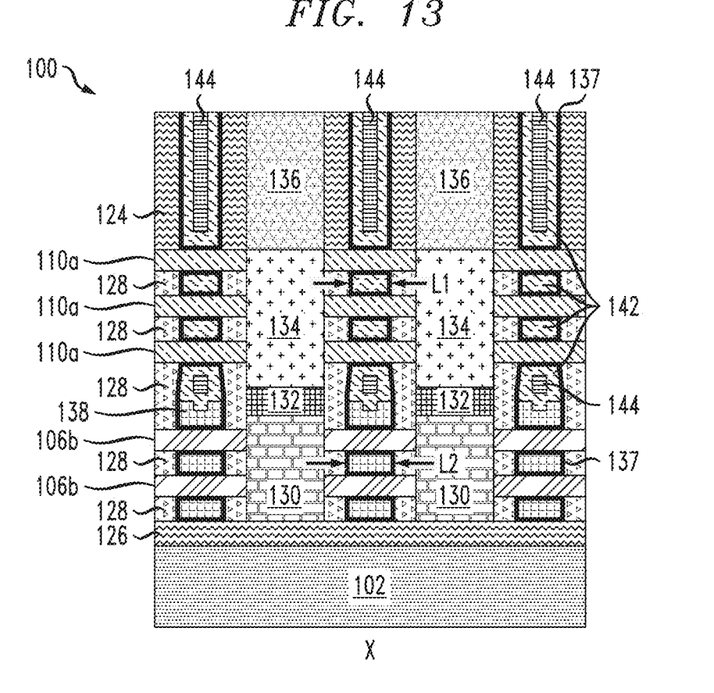
FIG. 13 is a cross sectional view of the semiconductor structure of FIG. 1, according to an illustrative alternative embodiment.

FIG. 13 illustrates the structure 100 of an alternative embodiment. In this embodiment, the gate length of each nanowire defined by L1 is less than the gate length of each nanosheet defined by L2. The gate lengths can be determined when forming the gate etch in FIG. 6, and the gate profile will be transferred to the profile similar to FIG. 13 after source/drain nanosheet recess and inner spacer formation as shown in FIG. 8.

It is to be understood that the methods discussed herein for fabricating a reduced coupling effect in semiconductor structures (e.g., CFETs) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor structure comprising:
   a first field-effect transistor disposed on a substrate, the first field-effect transistor comprising a stack of nanosheet layers, a first gate, and a first source/drain region; and
   a second field-effect transistor vertically stacked above the first field-effect transistor, the second field-effect transistor comprising a plurality of nanowires, a second gate, and a second source/drain region;
   wherein lateral sides of the stack of nanosheet layers are in-line with each other;
   wherein a bottom-most layer of each of the nanowires has negative tapered sidewalls;
   wherein the first gate and the second gate are vertically aligned, the first gate having a first length and the second gate having a second length, the first length being greater than the second length; and
   wherein the first source/drain region and the second source/drain region are vertically aligned.

2. The semiconductor structure of claim 1, further comprising a dielectric isolation layer disposed between the first source/drain region and the second source/drain region.

3. The semiconductor structure of claim 1, further comprising an interlevel dielectric layer disposed on the second source/drain region.

4. The semiconductor structure of claim 1, wherein the first gate comprises a p-type work function metal and the second gate comprises an n-type work function metal.

5. The semiconductor structure of claim 4, wherein the second gate further comprises a conductive metal disposed on the n-type work function metal.

6. The semiconductor structure of claim 4, further comprising gate spacers disposed on sidewalls of the second gate.

7. The semiconductor structure of claim 1, further comprising a sacrificial isolation layer disposed between the substrate and the first field-effect transistor.

8. A semiconductor structure comprising:
   a first field-effect transistor disposed on a substrate, the first field-effect transistor comprising a stack of nanosheet layers, a first gate, and a first source/drain region; and a second field-effect transistor vertically stacked above the first field-effect transistor, the second field-effect transistor comprising a plurality of nanowires, a second gate, and a second source/drain region;

wherein lateral sides of the stack of nanosheet layers are in-line with each other;

wherein a bottom-most layer of each of the nanowires has negative tapered sidewalls;

wherein the first gate and the second gate are vertically aligned, the first gate having a first length and the second gate having a second length, the first length being greater than the second length;

wherein the first source/drain region and the second source/drain region are vertically aligned; and wherein the first field-effect transistor is one of an n-type field-effect transistor and a p-type field-effect transistor and the second field-effect transistor is another one of an n-type field-effect transistor and a p-type field-effect transistor.

9. The semiconductor structure of claim 8, further comprising a dielectric isolation layer disposed between the first source/drain region and the second source/drain region.

10. The semiconductor structure of claim 8, further comprising an interlevel dielectric layer disposed on the second source/drain region.

11. The semiconductor structure of claim 8, wherein the first field-effect transistor is a p-type field-effect transistor and the first gate comprises a p-type work function metal and the second field-effect transistor is an n-type field-effect transistor and the second gate comprises an n-type work function metal.

12. The semiconductor structure of claim 11, further comprising gate spacers disposed on sidewalls of the second gate.

13. The semiconductor structure of claim 11, wherein the second gate further comprises a conductive metal disposed on the n-type work function metal.

14. The semiconductor structure of claim 8, further comprising a sacrificial isolation layer disposed between the substrate and the first field-effect transistor.

15. A method, comprising:
forming a first stack of nanosheet layers on a substrate;
forming a second stack of nanosheet layers on the first stack of nanosheet layers, wherein the nanosheet layers of the first stack and the second stack each comprise alternating silicon layers and silicon-germanium layers, wherein a bottom-most layer of the second stack is a silicon layer, wherein the first stack and the second stack are separated by a sacrificial silicon-germanium layer having a thickness greater than a thickness of the silicon-germanium layers of the first stack and the second stack;
forming a first hardmask on a top surface of the second stack of nanosheet layers; and
patterning the first hardmask and the second stack of nanosheet layers to form a plurality of nanowires, wherein a bottom-most layer of each of the nanowires has negative tapered sidewalls and comprises a portion of the sacrificial silicon-germanium layer.

16. The method of claim 15, wherein a bottom-most nanosheet layer of the first stack of nanosheet layers is a silicon-germanium layer, a top-most nanosheet layer of the first stack of nanosheet layers is a silicon layer and a top-most nanosheet layer of the second stack of nanosheet layers is a silicon layer.

17. The method of claim 16, further comprising:
forming a sacrificial layer over the plurality of nanowires;
selectively etching the sacrificial layer, the sacrificial silicon-germanium layer, the first stack of nanosheet layers and a portion of the substrate between a first set of nanowires and the second set of nanowires to form an opening;
removing the sacrificial layer and the first hardmask; and
depositing a shallow trench isolation layer in the etched portion of the substrate.

18. The method of claim 17, further comprising:
forming one or more dummy gates on a portion of a top-most layer of each of the nanowires, the one or more dummy gates having a second hardmask disposed on a top surface thereof;
forming gate spacers on sidewalls of each of the dummy gates and sidewalls of the second hardmask; and
etching each of the nanowires and the first stack of nanosheet layers such that portions of each of the nanowires and the first stack of nanosheet layers not underneath the gate spacers and the dummy gate are removed.

19. The method of claim 18, further comprising:
selectively etching a portion of the silicon-germanium layers of each of the nanowires and the first stack of nanosheet layers; and
forming inner spacers in the etched portions of the silicon-germanium layers.

20. The method of claim 19, wherein a length of the silicon-germanium layers between the inner spacers in each of the nanowires is less than a length of the silicon-germanium layers between the inner spacers in the first stack of nanosheet layers.

\* \* \* \* \*